US011113440B1

(12) United States Patent
Varma et al.

(10) Patent No.: US 11,113,440 B1
(45) Date of Patent: Sep. 7, 2021

(54) MEMORY MIGRATION IN HYBRID EMULATION

(71) Applicant: Synopsys, Inc., Mountain View, CA (US)

(72) Inventors: Ashutosh Varma, Milpitas, CA (US); Cédric Marie Frédéric René Babled, La Gaude (FR)

(73) Assignee: Synopsys, Inc., Mountain View, CA (US)

( * ) Notice: Subject to any disclaimer, the term of this patent is extended or adjusted under 35 U.S.C. 154(b) by 549 days.

(21) Appl. No.: 15/920,186

(22) Filed: Mar. 13, 2018

Related U.S. Application Data

(60) Provisional application No. 62/473,276, filed on Mar. 17, 2017.

(51) Int. Cl.
*G06F 30/33* (2020.01)
*G06F 30/331* (2020.01)

(52) U.S. Cl.
CPC ............ *G06F 30/33* (2020.01); *G06F 30/331* (2020.01)

(58) Field of Classification Search
CPC ............................... G06F 30/33; G06F 30/331
See application file for complete search history.

(56) References Cited

U.S. PATENT DOCUMENTS

| 5,727,150 A * | 3/1998 | Laudon ................... G06F 12/08 709/215 |
| 5,768,567 A | 6/1998 | Klein et al. |
| 6,034,538 A * | 3/2000 | Abramovici ........ G06F 15/7867 326/38 |
| 6,263,302 B1 | 7/2001 | Hellestrand et al. |
| 6,810,373 B1 * | 10/2004 | Harmon ................. G06F 30/33 703/14 |
| 7,072,820 B1 | 7/2006 | Bailey et al. |
| 7,346,482 B1 | 3/2008 | Ballagh et al. |
| 7,366,652 B2 * | 4/2008 | Wang ................... G06F 30/331 703/28 |
| 7,424,416 B1 | 9/2008 | Cavanagh et al. |

(Continued)

OTHER PUBLICATIONS

Li, Kai, and Paul Hudak. "Memory coherence in shared virtual memory systems." ACM Transactions on Computer Systems (TOCS) 7.4 (1989): 321-359. (Year: 1989).*

(Continued)

*Primary Examiner* — Omar F Fernandez Rivas
*Assistant Examiner* — David A Hopkins
(74) *Attorney, Agent, or Firm* — Fenwick & West LLP

(57) ABSTRACT

A hybrid emulation system and method for hybrid emulation of a design under test (DUT). The DUT has system memory logically segmented into a plurality of memory blocks. The hybrid emulation system comprises a hardware emulation system to emulate a first portion of the DUT during the hybrid emulation. The hybrid emulation system also comprises a simulation system to simulate a second portion of the DUT during the hybrid emulation. At least one of the hardware emulation system or the simulation system is configured to assign a memory block of the plurality of memory blocks to one of the hardware emulation system or the simulation system based on memory access statistics describing accesses to the memory block during the hybrid emulation.

20 Claims, 5 Drawing Sheets

(56) References Cited

U.S. PATENT DOCUMENTS

| | | | | |
|---|---|---|---|---|
| 7,594,042 | B2* | 9/2009 | Lim | G06F 12/0875 710/107 |
| 7,805,587 | B1* | 9/2010 | Van Dyke | G06F 12/10 711/202 |
| 8,600,722 | B1* | 12/2013 | Chan | G06F 30/33 703/14 |
| 8,719,547 | B2* | 5/2014 | Chinya | G06F 12/1027 711/207 |
| 8,793,628 | B1 | 7/2014 | Varma | |
| 8,943,449 | B1* | 1/2015 | Varma | G06F 30/331 716/106 |
| 2004/0254780 | A1* | 12/2004 | Diehl | G06F 30/331 703/28 |
| 2015/0106582 | A1* | 4/2015 | Mai | G06F 3/068 711/165 |
| 2015/0205729 | A1* | 7/2015 | Bates | G06F 9/45558 710/26 |

OTHER PUBLICATIONS

Wikipedia, "Direct memory access", accessed electronically on Jul. 18, 2020 (Year: 2020).*

Protic, Jelica, Milo Tomasevic, and Veljko Milutinovic. "Distributed shared memory: Concepts and systems." IEEE Parallel & Distributed Technology: Systems & Applications 4.2 (1996): 63-71. (Year: 1996).*

Augustin, Werner, Vincent Heuveline, and Jan-Philipp Weiss. "Convey HC-1—the potential of FPGAs in numerical simulation." Preprint Series of the Engineering Mathematics and Computing Lab 07 (2010). (Year: 2010).*

Kaestle, Stefan, et al. "Shoal: smart allocation and replication of memory for parallel programs." 2015 {USENIX} Annual Technical Conference ({USENIX}{ATC} 15). 2015. (Year: 2015).*

Nakamura, Yuichi, et al. "A fast hardware/software co-verification method for system-on-a-chip by using a C/C++ simulator and FPGA emulator with shared register communication." Proceedings of the 41st annual Design Automation Conference. 2004. (Year: 2004).*

Choi, Young-Kyu, et al. "In-depth analysis on microarchitectures of modern heterogeneous CPU-FPGA platforms." ACM Transactions on Reconfigurable Technology and Systems (TRETS) 12.1 (2019): 1-20. (Year: 2019).*

Cox, Alan L., and Robert J. Fowler. "Adaptive cache coherency for detecting migratory shared data." ACM SIGARCH Computer Architecture News 21.2 (1993): 98-108. (Year: 1993).*

Lyons, Michael J., et al. "The accelerator store: A shared memory framework for accelerator-based systems." ACM Transactions on Architecture and Code Optimization (TACO) 8.4 (2012): 1-22. (Year: 2012).*

Verghese, Ben, et al. "Operating system support for improving data locality on CC-NUMA compute servers." ACM SIGOPS Operating Systems Review 30.5 (1996): 279-289. (Year: 1996).*

Piccoli, Guilherme, et al. "Compiler support for selective page migration in NUMA architectures." Proceedings of the 23rd international conference on Parallel architectures and compilation. 2014. (Year: 2014).*

Olson, Lena E., et al. "Border control: Sandboxing accelerators." 2015 48th Annual IEEE/ACM International Symposium on Microarchitecture (MICRO). IEEE, 2015. (Year: 2015).*

Mazinani, Nadereh Hatami and P. Prinetto. "Synthesizing TLM-2.0 Communication Interfaces." (2009). Accessed via CORE.ac.uk, also available through Semantic Scholar with Corpus ID: 60392553 (Year: 2009).*

Olson, Lena E. Protecting host systems from imperfect hardware accelerators. The University of Wisconsin-Madison, 2016. (Year: 2016).*

Bershad, Brian N., Matthew J. Zekauskas, and Wayne A. Sawdon. The Midway distributed shared memory system. IEEE, 1993. (Year: 1993).*

Kim, Sang-Hoon, et al. "DEX: Scaling Applications Beyond Machine Boundaries." 2020 IEEE 40th International Conference on Distributed Computing Systems (ICDCS). IEEE, 2020. (Year: 2020).*

* cited by examiner

MEMORY MIGRATION IN HYBRID EMULATION

CROSS REFERENCE TO RELATED APPLICATIONS

This application claims a benefit of U.S. Patent Application No. 62/473,276, filed Mar. 17, 2017, the contents of which is incorporated by reference in its entirety.

TECHNICAL FIELD

The present application generally relates to hybrid emulation of a design under test (DUT).

BACKGROUND

Hybrid emulation combines emulation and virtual prototyping to enable earlier architecture validation and software development, as well as higher performance for software-driven hardware verification even when register transfer logic (RTL) for critical blocks is not available. For the hardware architect, it enables RTL processor subsystems loaded into an emulator to serve as a high-performance, cycle-accurate model for system on a chip (SoC) performance and architecture validation through cycle accurate interfaces to SystemC models of other blocks like memory controllers and subsystems in the virtual platform. From a software development perspective, an instruction accurate model in a virtual prototype is used for software development with the remaining SoC design blocks running at high speed in the emulator. For a verification engineering perspective, pre-verified processor subsystem blocks is moved out of the emulator and executed on the host platform, which uses a virtual prototype of the processor subsystem. This configuration frees up emulator capacity while increasing overall performance.

In hybrid emulation, a portion of design under test (DUT) (e.g., a graphics processing unit subsystem, a memory controller subsystem, or a universal serial bus (USB) controller subsystem) is emulated in a hardware emulation system such as SYNOPSYS ZEBU. The emulated portion of the design may be written in a register transfer level (RTL). The RTL may be synthesized into logic gates or other representation and loaded into the field programmable gate arrays (FPGAs) of the emulator. Another portion of the DUT (e.g. the processor or processors) may be represented by a model that is simulated in a simulation system, such as a host-computing device. For example, a virtual prototype of the processor may be simulated the simulation system. The simulation system and the emulation system can communicate with each other during the hybrid emulation. Hybrid emulation also may be referred to as co-simulation and emulation. The DUT may represent an integrated circuit such as an SoC, or a computing device with multiple chips.

Further, a DUT may have memory that is accessed by different components of the DUT. If the memory is located in the emulation system, accesses to the memory by the simulation system can be slow. If the memory is located in the simulation system, accesses to the memory by the emulation system can be slow.

DETAILED DESCRIPTION

Figure 1:
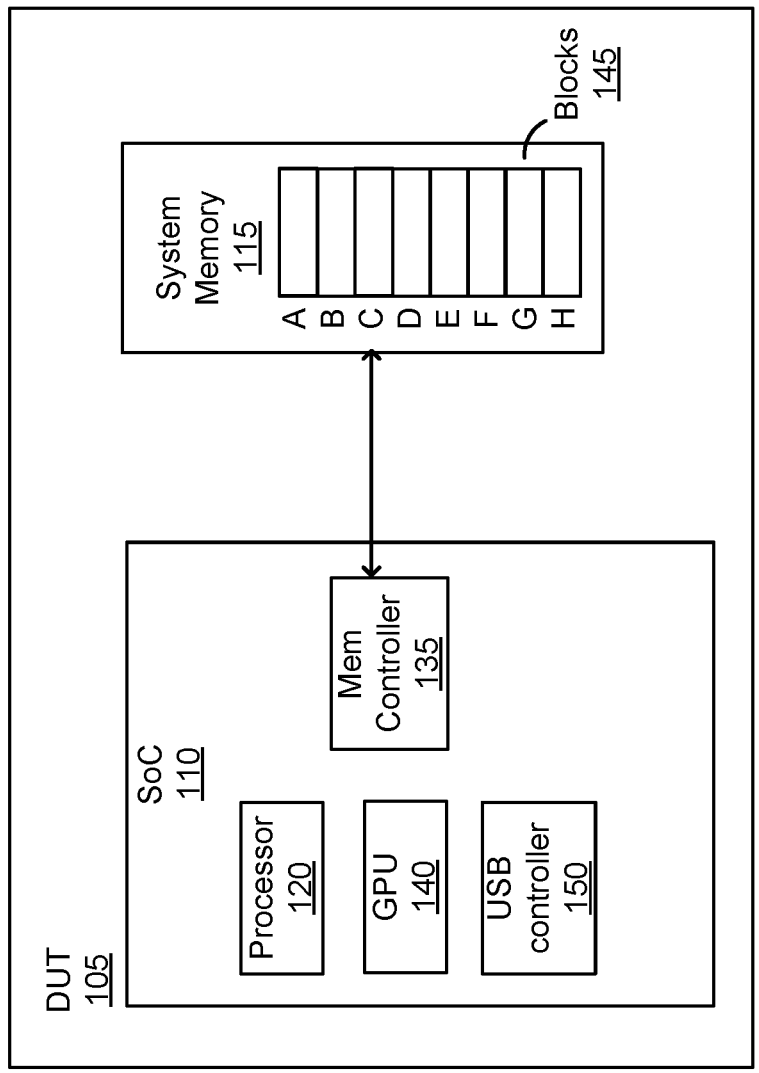
FIG. 1 is a block diagram of a design under test (DUT), according to one or more embodiments of the present disclosure.

The Figures (FIGS.) and the following description relate to preferred embodiments by way of illustration only. It should be noted that from the following discussion, alternative embodiments of the structures and methods disclosed herein will be readily recognized as viable alternatives that may be employed without departing from the principles of what is claimed.

Reference will now be made in detail to several embodiments, examples of which are illustrated in the accompanying figures. It is noted that wherever practicable similar or like reference numbers may be used in the figures and may indicate similar or like functionality. The figures depict embodiments of the disclosed system (or method) for purposes of illustration only. One skilled in the art will readily recognize from the following description that alternative embodiments of the structures and methods illustrated herein may be employed without departing from the principles described herein.

Configuration Overview

In one or more embodiments, disclosed is a seamless memory migration scheme where segments of the actual memory storage migrate from one platform (e.g. emulation system or simulation system) to the other depending on the access frequency. This migration may be perceived as memory sharing because the memory may be accessed by both platforms (e.g. emulation system or simulation system.

One or more embodiments disclosed herein relate to a hybrid emulation system for hybrid emulation of a design under test (DUT). The DUT has system memory logically segmented into a plurality of memory blocks. The hybrid emulation system comprises a hardware emulation system to emulate a first portion of the DUT during the hybrid emulation. The hybrid emulation system also comprises a simulation system to simulate a second portion of the DUT during the hybrid emulation. At least one of the hardware emulation system or the simulation system may be configured to assign a memory block of the plurality of memory blocks to one of the hardware emulation system or the simulation system based on memory access statistics describing accesses to the memory block during the hybrid emulation.

This dynamic assignment of a memory block can allow the memory block to be migrated from the hardware emulation system to the simulation system or vice versa during runtime of the hybrid emulation. As a result, the memory block is migrated to the system (i.e., hardware emulation system or simulation system) that most frequently accesses the memory block, thereby reducing average latency in accessing the memory block and increasing the performance of the hybrid emulation system.

In one or more embodiments of the present disclosure, the memory access statistics can comprise first memory access statistics describing accesses by the emulated first portion of the DUT to the memory block during the hybrid emulation, and second memory access statistics describing accesses by the simulated second portion of the DUT to the memory block during the hybrid emulation. The memory block may be assigned to one of the hardware emulation system or the simulation system based on the first memory access statistics and the second memory access statistics. For example, the memory block may be assigned to one of the hardware emulation system or the simulation system based on a comparison of the first memory access statistics and the second memory access statistics.

In one or more embodiments of the present disclosure, the memory block may be initially assigned to the simulation system according to a default assignment. The simulation system may be configured to collect the memory access statistics describing accesses to the memory block during the hybrid emulation while the memory block is assigned to the simulation system. The simulation system assigns the memory block to one of the hardware emulation system or the simulation system based on the memory access statistics.

In one or more embodiments of the present disclosure, the memory block may be assigned to one of the hardware emulation system or the simulation system by transferring contents of the memory block to the one of the hardware emulation system or the simulation system from the other one of the hardware emulation system or the simulation system. Thereafter, an ownership table may be updated to indicate that the one of the hardware emulation system or the simulation system is owner of the memory block.

In one or more embodiments of the present disclosure, the hardware emulation system may be configured to convert a dynamic random access memory (DRAM) address generated by the emulated first portion of the DUT to a linear address for accessing the memory block.

In one or more embodiments of the present disclosure, a memory access by the hardware emulation system or the simulation system to a memory block assigned to the other one of the emulation system or the simulation system may be performed as a blocking read or write without any caching.

In one or more embodiments of the present disclosure, the first portion of the DUT may comprise a memory controller and the second portion of the DUT can comprise a processor.

In one or more embodiments of the present disclosure, the simulation system can comprise a simulation memory store corresponding to the system memory. The hardware emulation system can comprise an emulation memory store corresponding to the system memory. The memory block may be assigned to one of the simulation memory store of the simulation system or the emulation memory store of the hardware emulation system based on the memory access statistics.

Example Design Under Test

FIG. 1 is a block diagram of a design under test (DUT), according to one or more embodiments of the present disclosure. The DUT 105 may be a computing device with multiple chips. The DUT 105 includes a system on chip (SOC) 110 and system memory 115. The SoC can be an integrated circuit (IC).

The SoC includes a processor 120, a memory controller 135, a graphics processing unit (GPU) 140, and a universal serial bus (USB) controller 150. The processor 120, graphical processing unit (GPU) 140, USB controller 150 and other internet protocol (IP) blocks of the SoC 110 access the system memory 115 through the memory controller 135. The memory controller 135 controls memory accesses to the system memory 115. The memory controller 135 accesses system memory 115 by providing a memory address to the system memory 115. The memory address can be in a DRAM address format. The DRAM address format may include a bank address, column address, and a row address. The memory controller 135 writes data to the provided memory address or reads data from the provided memory address.

The system memory 115 can be include one or more dynamic random access memory (DRAM) chips. In some embodiments, the system memory 115 can be part of the SoC 110. The system memory 115 is logically divided into separate memory blocks 145. For example, the memory blocks 145 can be pages of memory that are 1 KB in size. The memory blocks 145 are labeled A through H.

The DUT 105 can be tested during a hybrid emulation, as will be explained by reference to FIG. 2.

Example Hybrid Emulation System

Figure 2:
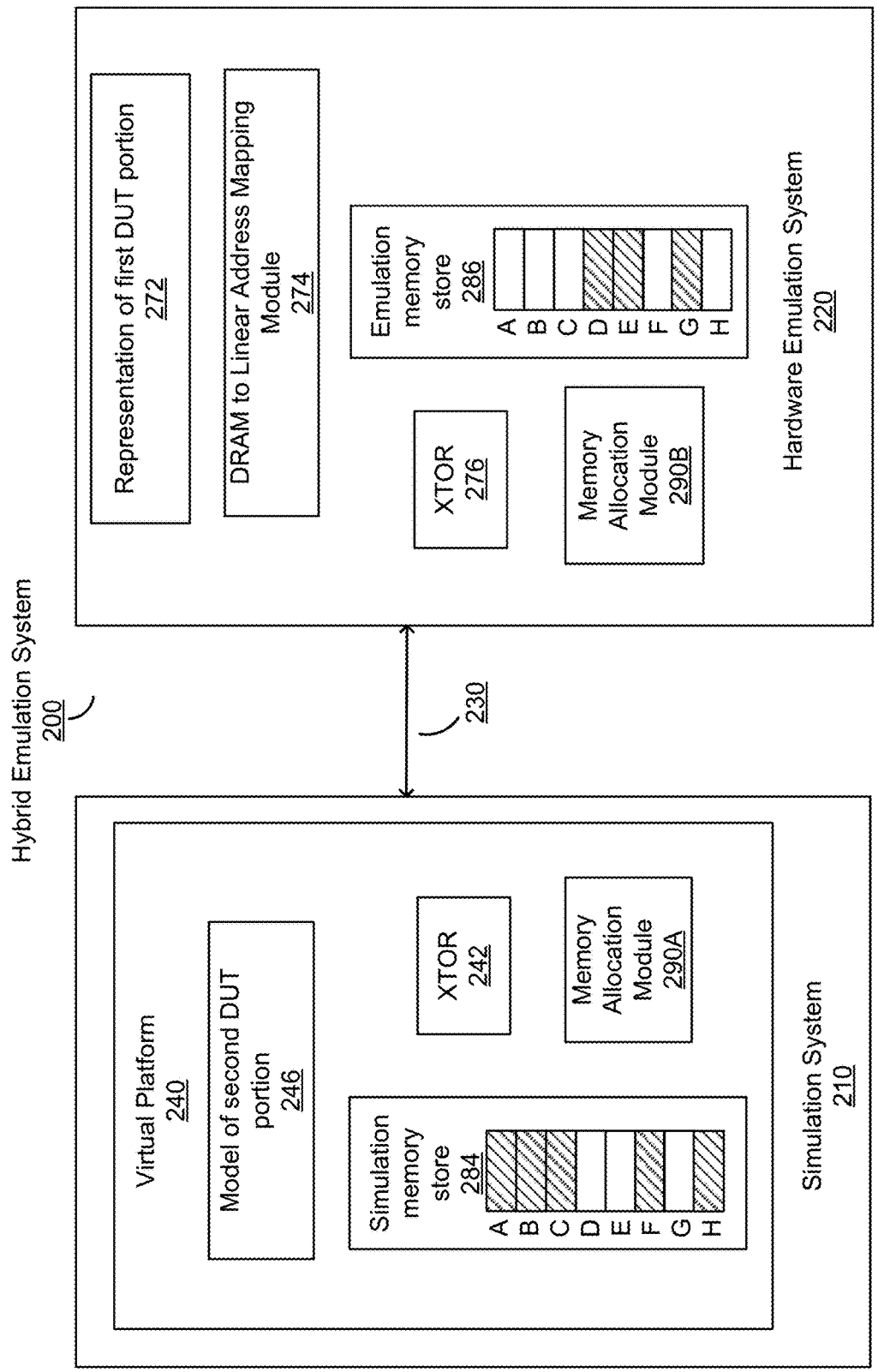
FIG. 2 is a block diagram of a hybrid emulation system configured to perform a hybrid emulation of a DUT, according to one or more embodiments of the present disclosure.

FIG. 2 is a block diagram of a hybrid emulation system 200 configured to perform a hybrid emulation of a DUT 105, according to one or more embodiments of the present disclosure. The hybrid emulation system 200 includes a simulation system 210 and a hardware emulation system 220.

Hybrid emulation combines emulation and virtual prototyping to enable earlier architecture validation and software development, as well as higher performance for software-driven hardware verification even when RTL for critical blocks isn't available. For the hardware architect, it enables RTL processor subsystems loaded into an emulator 220 to serve as a high-performance, cycle-accurate model for SoC performance and architecture validation through cycle accurate interfaces to SystemC models of other blocks like memory controllers and subsystems in the virtual platform. For the software developer, instruction accurate models in the virtual prototype are used for software development with the remaining SoC design blocks running at high speed in the emulator 220. For the verification engineer, pre-verified processor subsystem blocks can be moved out of the emulator 220 and executed on the host platform (e.g. the simulation system 210) using a virtual prototype of the processor subsystem, freeing up emulator capacity while increasing overall performance.

In hybrid emulation, a portion (e.g., a subsystem such as a memory controller 135, GPU 140, USB controller 150) of a DUT 105 is emulated in a hardware emulation system 220. For example, the hardware emulation system 220 can be a SYNOPSYS ZEBU emulation system. The emulated portion of the DUT 105 may be written in a register transfer language (RTL) that is synthesized into logic gates or other representation and then loaded into the field programmable gate arrays (FPGAs) of the emulator 220. Another portion (e.g., a processor) of the DUT 105 may be represented by a model 246 that is simulated in a simulation system 210. For example, the model 246 may be a virtual prototype of a processor. The simulation system 210 and the hardware emulation system 220 can communicate with each other during the hybrid emulation over a communication channel 230. Hybrid emulation also may be referred to as co-simulation and emulation.

The DUT 105 can have system memory 115 that is accessed by different components of the DUT 105 through the memory controller 135. If the system memory 105 is emulated in the hardware emulation system 220, then accesses to the emulated memory by the simulation system 210 can be slow. If the system memory 105 is simulated in the simulation system, then accesses to the simulated memory by the hardware emulation system 220 can be slow. In one or more embodiments of the present disclosure, a seamless memory migration scheme is disclosed where segments (i.e. blocks) of the system memory 105 migrate from one platform (e.g. hardware emulation system 220 or simulation system 210) to the other depending on memory access statistics such as access frequency. In other words, system memory 115 is segmented logically into blocks and localization of a block in the simulation system 210 or hardware emulation system 220 is determined dynamically and optimally at runtime. The user perceives this migration as memory sharing because the memory can be accessed by both platforms (e.g. hardware emulation system 220 or simulation system 210).

As previously described, the hybrid emulation system 200 includes a simulation system 210 and a hardware emulation system 220. The hardware emulation system 220 is configured to emulate a first portion of the DUT (e.g. memory controller 135, GPU 140, USB controller 150). The hardware emulation system 220 includes an emulation representation 272 of a first portion of the DUT. The emulation representation 272 may be referred to as the emulated portion of the DUT.

The hybrid emulation system 220 also includes a DRAM to linear address mapping module 274, a transactor 276, an emulation memory store 286, and a memory allocation module 290B. The hardware emulation system 220 can include one or more FPGAs (not shown), and the various components 272, 274, 276 and 290B may be implemented with configured logic gates of the FPGAs. The hardware emulation system 220 can also include one or more physical memory chips (not shown), and the emulation memory store 286 can be mapped to these physical memory chips.

The simulation system 210 is configured to simulate a second portion of the DUT (e.g. processor 130) during a hybrid emulation. The simulation system 210 can be a host computing device with a physical processor and physical memory. The simulation system 110 includes a virtual platform 240. The virtual platform 240 includes a model 146 for a second portion of the DUT. For example, the model 146 can be a virtual prototype of the processor 120 of the DUT 105. The virtual prototype can be a SystemC virtual prototype. The virtual prototype can be an instruction accurate processor model. The virtual platform 240 may be executed on the simulation system 110, thereby resulting in a simulation of the second DUT portion. The model 246 of the second portion of the DUT may be referred to as the simulated portion of the DUT. The virtual platform 140 also includes a transactor 242, a simulation memory store 284 and memory allocation module 290B.

The simulation memory store 284 can be a simulation representation of the system memory 115. It may be referred to as a simulated system memory. The emulation memory store 286 can be an emulation representation of the system memory 115. It may be referred to as an emulated system memory. The system memory 115 is split into several memory blocks 145 and the memory blocks 145 are selectively assigned to either the simulation memory store 284 or the emulation memory store 286. The side that the memory block is assigned to may be considered the owner of the memory block. For example, the simulation system 210 owns memory blocks A, B, C, F and H. The hardware emulation system 220 owns memory blocks D, E and G. Each memory block can only be owned by one of the two systems 210 or 220 at a time. The system that is assigned ownership of a memory block may store the data for that memory block, while the other system does not store data for that memory block.

The memory allocation modules 290A and 290B are configured to dynamically allocate ownership of the memory blocks between the simulation system 210 and the hardware emulation system 220 during runtime of a hybrid emulation. The memory allocation modules 290A and 290B may first assign the memory blocks to either the hardware emulation system 220 or the simulation system 210 according to a default assignment before the hybrid emulation begins. In one specific embodiment, the default assignment is for all memory blocks to be assigned to the simulation memory store 284 of the simulation system 210.

During the hybrid emulation, the memory allocation modules 290A and 290B collect memory access statistics describing memory accesses made by the simulated DUT portion 246 to the memory blocks. The memory allocation modules 290A and 290B also collect memory access statistics describing memory accesses made by the emulated DUT portion 272 to the memory blocks. The statistics are collected separately for each memory block. Examples of statistics are number of accesses, frequency of accesses, number of accesses over a particular time period, frequency of accesses over a particular time period, etc.

Each memory allocation module 290 collects access statistics for memory blocks in its local memory store. Memory allocation module 290A collects statistics for the memory blocks that are currently assigned to simulation memory store 284. For example, memory allocation module 290A collect access statistics for accesses to memory block A. Memory allocation module 290B collects statistics for the memory blocks that are currently assigned to emulation memory store 286. For example, memory allocation module 290B collects access statistics for accesses to memory block D.

For a given memory block, the memory allocation modules 290A and 290B can use the access statistics to determine whether to assign the memory block to the simulation system 210 or the hardware emulation system 220. The memory block is assigned in accordance with this determination. For example, the access statistics for memory accesses by the emulated DUT portion 272 to memory block A can be compared to access statistics for the memory accesses by the simulated DUT portion 246 to memory block A. If the comparison indicates that memory block A is more frequently accessed by the emulated DUT portion 272, the memory block A is assigned to the emulation memory store 286 in the hardware emulation system 220. On the other hand, if the comparison indicates that memory block A is more frequently accessed by the simulated portion 246 of the DUT, memory block A is assigned to the simulation memory store 284 in the simulation system 210. This comparison of memory access statistics for a memory block and assignment of the memory block can be done separately for each memory block.

The assignment process can involve migrating a memory block from one system to another. The migration process starts by freezing access to the memory block. The contents of the memory block are transferred from one system to another system. Further, each system may maintain a mirrored ownership table of owned blocks which indicates which blocks are owned by which system. The ownership table is updated to reflect the new ownership of the memory block when ownership changes.

Once a system (hardware emulation system 220 or simulation system 210) has the ownership of a block, it can read and write to it at any time while a request for the block is made by the other system. By way of example, note that ownership may allow access without invoking an ownership transfer. The other system may go through a protocol to be able access, and that access is guaranteed to be non-overlapping to avoid race-conditions.

In one example embodiment, the memory space of the system memory 115 is split into fixed length memory blocks 145 referred to as pages. The page size can be user defined. The pages are in the following categories:

- Exclusively used by the simulated portion of the DUT 246 (e.g. OS kernel/drivers/application code/data segments); No DMA (direct memory access) access from emulated design 272; Page is allocated to the simulation system 210; DMI (Direct memory interface) enabled always for access by the simulated DUT portion 246;
- Mostly used by the simulated portion of the DUT 246; Also accessed by emulated design 272 DMA (e.g. I/O peripheral driver data segments or DMA space); Page is allocated to the simulation system 210; DMI can be enabled for access by the simulated DUT portion 246; emulated design 274 accesses these pages using transactors XTORs 242 and 276
- Mostly or exclusively used by the emulated design 274; simulated DUT portion 246 may also access (e.g. GPU instruction space); Page is allocated to the emulation memory store 286; DMI disabled for access from the simulated DUT portion 246; simulated DUT portion 246 accesses page through transactors XTORs 242 and 276.

The determination of page category may be done automatically at runtime based on nature of accesses (e.g., access statistics). The default of category (a) is used as the starting allocation for all pages. When an emulated portion of the DUT 272 starts accessing a page, the DMI access will be disabled for that page and access statistics are collected to determine optimal localization and when to migrate the page to the hardware emulation system 220.

Beneficially, a segment of memory can thus be maintained "local" to one abstraction (i.e. the simulation system 210 or hardware emulation system 220) on the basis of proportion of its accesses from that abstraction versus the other. This allows fragmentation of the system memory 115 such that majority of the access to system memory 115 is local in the abstraction of the dominant access. This can reduce the average latency in accessing data for the memory blocks 145 and increases the performance of the hybrid emulation system 200.

Any access from the other abstraction is transferred as a blocking read or write directly into the local memory store of the owner abstraction without any caching of the data at the requesting abstraction. Access may be guaranteed to be non-overlapping to avoid race conditions. This may be achieved by scheduling access at guaranteed "safe" slots within the respective simulation or emulation system. If this read/write through is reasonably fast, it will not have any detrimental impact on overall system performance. The lack of caching also avoids the need to maintain coherency in a cache and avoids problems such as overhead with cache invalidation and cache line flushing, and race conditions.

Figure 3:
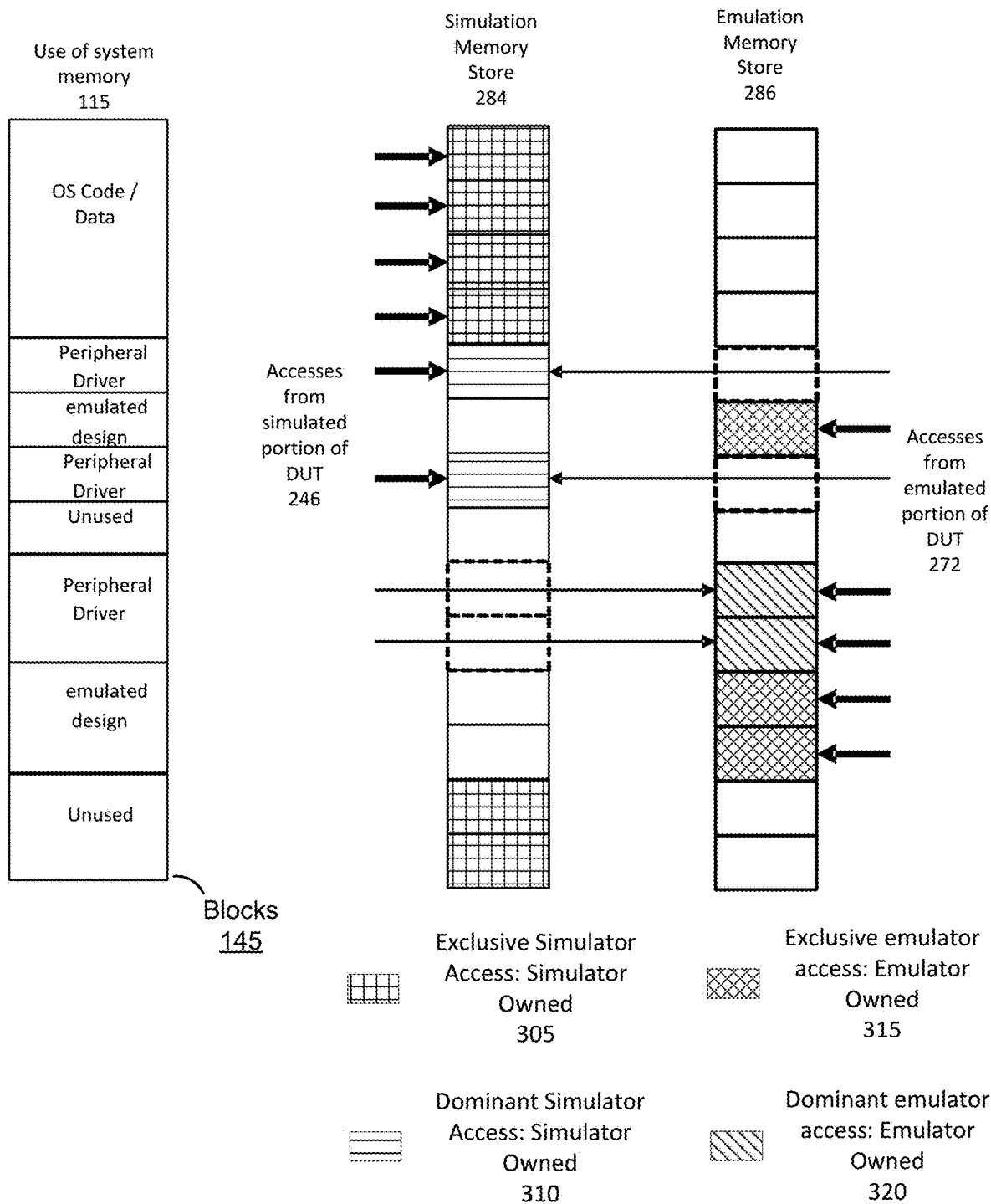
FIG. 3 is a diagram that illustrates accesses to memory blocks that are allocated between the simulation system and hardware emulation system, according to one or more embodiments of the present disclosure.

FIG. 3 is a diagram illustrating accesses to memory blocks that are allocated between the simulation system 210 and hardware emulation system 220, according to one or more embodiments of the present disclosure.

The left column of the diagram shows an example of usage of different memory blocks 145 of the system memory 115. The middle column of the diagram shows which memory blocks are assigned to the simulation memory store 284. The right column of the diagram shows which memory blocks are assigned to the emulation memory store 286.

Some memory blocks 305 are exclusively accessed by the simulated portion of the DUT 246. These memory blocks 305 are assigned to and owned by the simulation memory store 284 and never accessed by the emulated portion of the DUT 272. Some memory blocks 310 are predominantly accessed by the simulated portion of the DUT 246. These memory blocks 310 are assigned to and owned by the simulation memory store 284. These memory blocks 310 can still be accessed by the emulated portion of the DUT 272.

Some memory blocks 315 are exclusively accessed by the emulated portion of the DUT 272. These memory blocks 315 are assigned to and owned by the emulation memory store 286 and are never accessed by the simulated portion of the DUT 246. Some blocks 320 are predominantly accessed by the emulated portion of the DUT 272. These blocks 320 are assigned to and owned by the emulation memory store 286. These blocks 320 can still be accessed by the simulated portion of the DUT 246.

The assignment of the memory blocks 145 to either the simulation memory store 284 and emulation memory store 286 can be changed while the hybrid emulation is running. For example, access statistics describing accesses to the memory blocks 145 can be collected over a period of time. If the access statistics indicate that the accesses to a memory block 145 are shifting towards the emulated portion of the DUT 272 or the simulated portion of the DUT 246, the memory block 145 can be re-assigned.

Referring back to FIG. 2, transactor 242 and transactor 276 are used to facilitate communication between the simulation system 210 and the hardware emulation system 220 during memory accesses. If the simulated DUT portion 246 wishes to access the emulation memory store 286, it sends an access request through transactor 242, which is passed to transactor 276 and then to emulation memory store 286. The appropriate memory block is accessed from the emulation memory store 286 and, for read accesses, the contents of the memory block are returned through transactor 276 and transactor 242. If the emulated DUT portion 272 wishes to access the simulation memory store 284, it sends a request through transactor 276, which is passed to transactor 242 and then to simulation memory store 284. The appropriate memory block is accessed from the simulation memory store 284 and, for read accesses, the contents of the memory block are returned through transactor 242 and transactor 276.

DRAM to Linear Address Mapping

Referring still to FIG. 2, the DRAM to linear address mapping module 274 receives DRAM addresses from the emulated DUT portion 272. The DRAM to linear address mapping module 274 converts the DRAM addresses into linear addresses. The linear addresses may be used to access memory blocks assigned to the emulation memory store 286 or simulation memory store 284.

The emulated DUT portion 272 may include configured logic gates representing a memory controller 135 that generates memory addresses in a DRAM address format. The DRAM address format may include a bank address, a row address, and a column address. However, the simulation memory store 284 and emulation memory store 286 typically use a linear address space. Thus, a DRAM to Linear address conversion is required in the emulator 220 for memory accesses initiated by the emulated DUT portion 272. This may be accomplished by the DRAM to linear address mapping module 274. The DRAM to linear address mapping module 274 may be written by a user.

The DRAM to linear address mapping module 274 is localized in the emulator 220, thus simplifying overall design of the simulation memory store 284 and improving the virtual platform 240 performance. All interaction between the virtual platform 240 and the emulation memory store 286 is based on linear addressing, which allows for fast burst access of contiguous regions of either the simulation memory store 284 or the emulation memory store 286 by utilizing simple transactor XTOR 242 or 276 in either direction.

Figure 4:
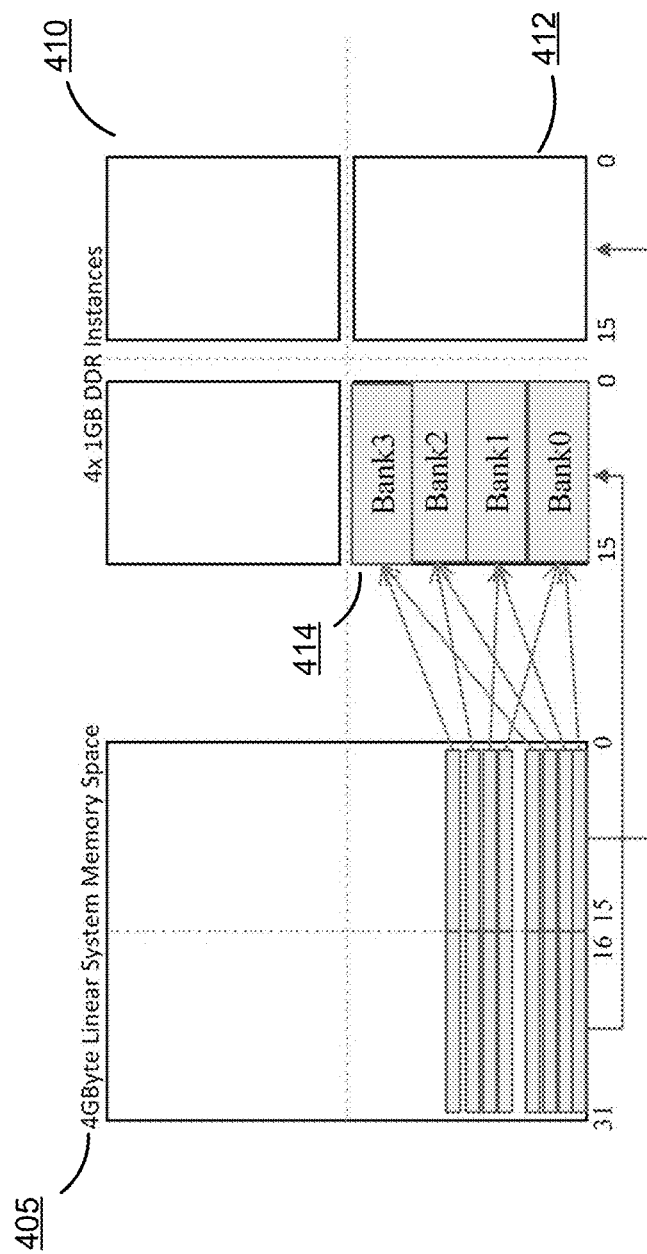
FIG. 4 is a diagram that illustrates mapping between linear memory space and DRAM memory space, according to one or more embodiments of the present disclosure.

FIG. 4 is a diagram that illustrates mapping between linear memory space and DRAM memory space, according to one or more embodiments of the present disclosure. A linear memory space 405 is shown on the left. Four DRAM chips of the system memory 115 in a DRAM memory space 410 are shown in the right. Each linear address is associated with 32 bits of data. The linear address space with a 32-bit word size as seen from a CPU system point of view usually becomes split across different DRAM chips and banks of the DRAM chips. For example, data bits 0-15 for each linear address are mapped to one DRAM chip 412 and data bits 16-31 for each linear address are mapped to another DRAM chip 414. Different linear addresses can map to different memory banks 0-3 of a DRAM chip in an interleaved manner.

Example Process Flow

Figure 5:
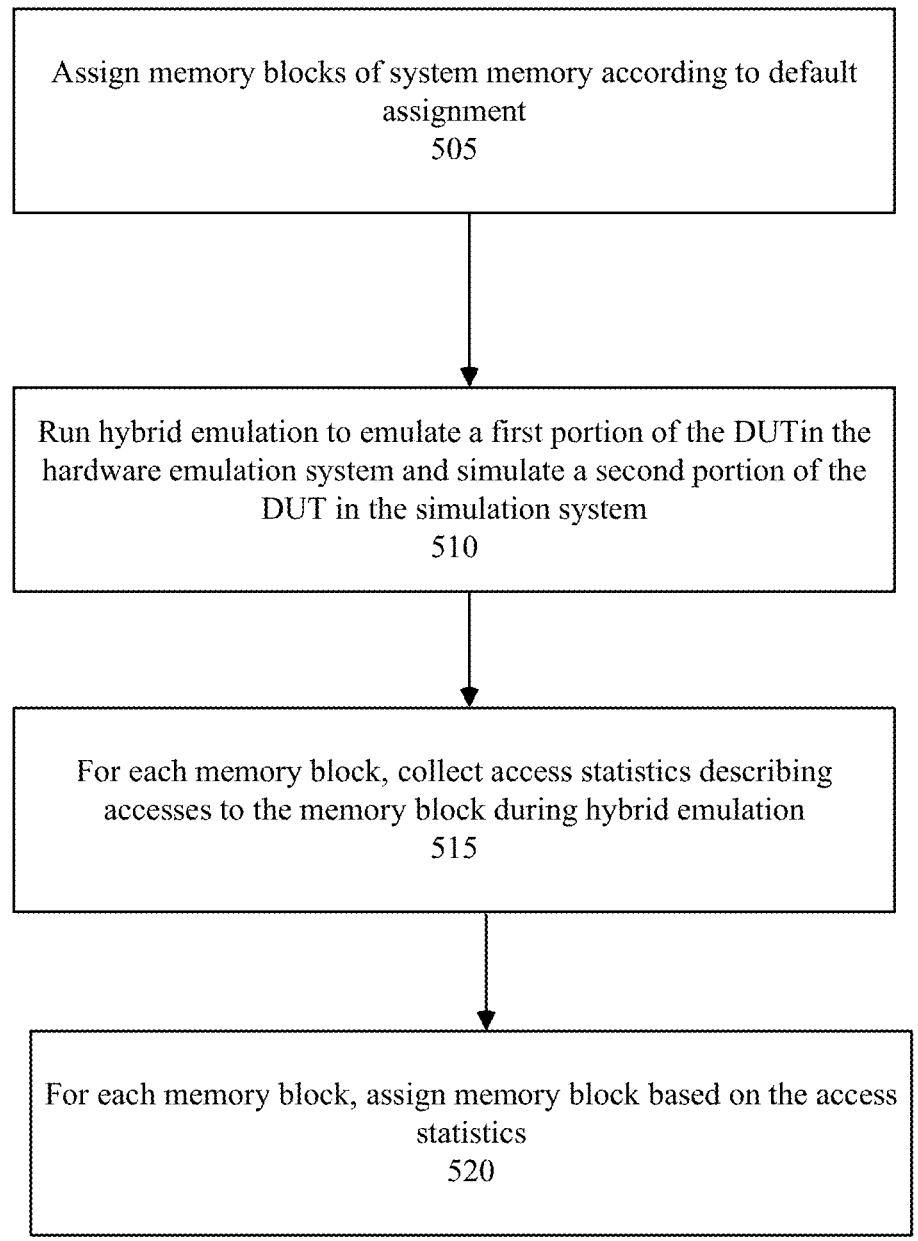
FIG. 5 is a flowchart for a method of operation in the hybrid emulation system, according to one or more embodiments of the present disclosure.

FIG. 5 is a flowchart for a method of operation in the hybrid emulation system, according to one or more embodiments of the present disclosure. In step 505, memory blocks 145 of system memory 115 are assigned to either the simulation system 210 or hardware emulation system 220 according to a default assignment. For example, the default assignment may be that all the memory blocks 145 are initially assigned to the simulation system 210.

In step 510, the hybrid emulation is run. As a result, a first portion of the DUT is emulated in the hardware emulation system 220. A second portion of the DUT is simulated in the simulation system 210.

In step 515, for each memory block, access statistics describing accesses to the memory blocks are collected during runtime of the hybrid emulation. Separate access statistics are collected for each memory block.

In step 520, for each memory block, the memory block is assigned to either the hardware emulation system 220 or the simulation system 210 based on the access statistics collected for the memory block. The assignment can involve migrating a memory block from one system to another by transferring contents of the memory block to the hardware emulation system 220 or the simulation system 210 from the one of the hardware emulation system 220 or the simulation system 210. Additionally, an ownership table is updated to indicate that the hardware emulation system 220 or the simulation system 210 is the new owner of the memory block.

In one or more embodiments of the present disclosure, a non-transitory computer readable medium stores instructions that when executed by a processor cause the processor to implement the operations described herein.

In addition, it is noted that a host system for a simulation system (e.g., as illustrated and described in FIG. 1) may be a computing system with one or more processors (generally, processor), a memory, a storage (e.g., disk), one or more input/output (I/O), and/or a network connection. The host system may be configured to communicatively couple with the emulation system.

What is claimed is:

1. A hybrid emulation system for hybrid emulation of a design under test (DUT) having system memory logically segmented into a plurality of memory blocks, the system comprising:
a hardware emulation system to emulate a first portion of the DUT during the hybrid emulation;
and a simulation system to simulate a second portion of the DUT during the hybrid emulation,
wherein at least one of the hardware emulation system or the simulation system is configured to:
assign a first set of the plurality of memory blocks to a first owning system, wherein the first owning system is the simulation system or the emulation system;
assign a second set of the plurality of memory blocks to a second owning system, wherein the second owning system is the hardware emulation system or the simulation system,
wherein in response to the second owning system being the simulation system, direct memory access (DMA) to the second set of memory blocks is disabled for the emulated first portion of the DUT,
wherein in response to the second owning system being the emulation system, direct memory interface (DMI) to the second set of memory blocks is disabled for the simulated second portion of the DUT; and
re-assign, during hybrid emulation, a memory block of the first set of memory blocks to a requesting system based on memory access statistics describing access to the memory block during hybrid emulation.

2. The hybrid emulation system of claim 1,
wherein the memory access statistics comprise first memory access statistics describing accesses by the emulated first portion of the DUT to the memory block during the hybrid emulation, and second memory access statistics describing accesses by the simulated second portion of the DUT to the memory block during the hybrid emulation, and
wherein the memory block is re-assigned to the requesting system based on the first memory access statistics and the second memory access statistics.

3. The hybrid emulation system of claim 2,
wherein the memory block is re-assigned to the requesting system based on a comparison of the first memory access statistics and the second memory access statistics.

4. The hybrid emulation system of claim 1,
wherein the memory block is initially assigned to the first owning system according to a default assignment, wherein the first owning system is the simulation system and the requesting system is the hardware emulation system, and
the simulation system is configured to:
collect the memory access statistics describing accesses to the memory block during the hybrid emulation while the memory block is assigned to the simulation system; and
re-assign the memory block to the hardware emulation system based on the memory access statistics.

5. The hybrid emulation system of claim 1, wherein the memory block is re assigned to the requesting system by:
transferring contents of the memory block to requesting system from the first owning system; and
updating an ownership table to indicate that the requesting system is owner of the memory block.

6. The hybrid emulation system of claim 1, wherein the hardware emulation system is configured to convert a dynamic random access memory (DRAM) address generated by the emulated first portion of the DUT to a linear address for accessing the memory block.

7. The hybrid emulation system of claim 1, wherein a memory access by the hardware emulation system or the simulation system to a memory block assigned to the other one of the emulation system or the simulation system is performed as a blocking read or write without any caching.

8. The hybrid emulation system of claim 1, wherein the first portion of the DUT comprises a memory controller and the second portion of the DUT comprises a processor.

9. The hybrid emulation system of claim 1,
wherein the simulation system comprises a simulation memory store corresponding to the system memory,
wherein the hardware emulation system comprises an emulation memory store corresponding to the system memory, and
wherein the memory block is re-assigned to one of the simulation memory store of the simulation system or the emulation memory store of the hardware emulation system based on the memory access statistics.

10. The hybrid emulation system of claim 1, wherein the at least one of the hardware emulation system or the simulation system is configured to schedule a plurality of access slots for the requesting system to access, during the hybrid emulation, the memory block.

11. A method for hybrid emulation of a design under test (DUT) having system memory logically segmented into a plurality of memory blocks, the method comprising:
emulating a first portion of the DUT in an emulation system during the hybrid emulation;
simulating a second portion of the DUT in a simulation system during the hybrid emulation;
assigning a first set of the plurality of memory blocks to a first owning system, wherein the first owning system is the simulation system or the emulation system;
assigning a second set of the plurality of memory blocks to a second owning system, wherein the second owning system is the hardware emulation system or the simulation system,
wherein in response to the second owning system being the simulation system, direct memory access (DMA) to the second set of memory blocks is disabled for the emulated first portion of the DUT,
wherein in response to the second owning system being the emulation system, direct memory interface (DMI) to the second set of memory blocks is disabled for the simulated second portion of the DUT; and
re-assigning, during hybrid emulation, a memory block of the first set of memory blocks to a second requesting system based on memory access statistics describing access to the memory block during hybrid emulation.

12. The method of claim 11,
wherein the memory access statistics comprise first memory access statistics describing accesses by the emulated first portion of the DUT to the memory block during the hybrid emulation, and second memory access statistics describing accesses by the simulated second portion of the DUT to the memory block during the hybrid emulation, and
wherein the memory block is reassigned to the requesting system based on the first memory access statistics and the second memory access statistics.

13. The method of claim 12,
wherein the memory block is re-assigned to the requesting system based on a comparison of the first memory access statistics and the second memory access statistics.

14. The method of claim 11, further comprising:
assigning the memory block to the first owning system according to a default assignment, wherein the first owning system is the simulation system and the requesting system is the hardware emulation system;
collecting the memory access statistics describing accesses to the memory block during the hybrid emulation while the memory block is assigned to the simulation system;
and re-assigning the memory block to the hardware emulation system based on the access memory statistics.

15. The method of claim 11, wherein the memory block is re-assigned to the requesting system by:
transferring contents of the memory block to the requesting system from the first owning system; and
updating an ownership table to indicate that the requesting system is owner of the memory block.

16. The method of claim 11, further comprising:
converting, in the hardware emulation system, a dynamic random access memory (DRAM) address generated by the emulated first portion of the DUT to a linear address for accessing the memory block.

17. The method of claim 11, wherein a memory access by the hardware emulation system or the simulation system to a memory block assigned to the other one of the emulation system or the simulation system is performed as a blocking read or write without any caching.

18. The method of claim 11,
wherein the simulation system comprises a simulation memory store corresponding to the system memory,
wherein the hardware emulation system comprises an emulation memory store corresponding to the system memory,
wherein the memory block is re-assigned to one of the simulation memory store of the simulation system or the emulation memory store of the hardware emulation system based on the memory access statistics.

19. A non-transitory computer readable medium comprising stored instructions, which when executed by one or more processors associated with a hybrid emulation system for hybrid emulation of a design under test (DUT), cause the one or more processors to:
emulate a first portion of the DUT during the hybrid emulation;
a simulation system to simulate a second portion of the DUT during the hybrid emulation;
wherein at least one of the hardware emulation system or the simulation system is configured to:
assign a first set of the plurality of memory blocks to a first owning system, wherein the first owning system is the simulation system or the emulation system;
assign a second set of the plurality of memory blocks to a second owning system, wherein the second owning system is the hardware emulation system or the simulation system,
wherein in response to the second owning system being the simulation system, direct memory access (DMA) to the second set of memory blocks is disabled for the emulated first portion of the DUT,
wherein in response to the second owning system being the emulation system, direct memory interface (DMI)

to the second set of memory blocks is disabled for the simulated second portion of the DUT; and re-assign, during hybrid emulation, a memory block of the first set of memory blocks to a second requesting system based on memory access statistics describing access to the memory block during hybrid emulation.

20. The non-transitory computer readable medium of claim 19, wherein the instruction to re-assign, during the hybrid emulation, the memory block further comprises instructions which when executed by the one or more processors cause the one or more processors to:

re-assign the memory block to one of a simulation memory store or a emulation memory store based on the memory access statistics, wherein the simulation memory store and the emulation memory store correspond to a system memory.

* * * * *